(12) United States Patent
Romanovskyy

(10) Patent No.: US 9,529,673 B2
(45) Date of Patent: Dec. 27, 2016

(54) MEMORY DEVICE HAVING ADJUSTABLE REFRESH PERIOD AND METHOD OF OPERATING THE SAME

(71) Applicant: TAIWAN SEMICONDUCTOR MANUFACTURING COMPANY, LTD., Hsinchu (TW)

(72) Inventor: Sergiy Romanovskyy, Ottawa (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 18 days.

(21) Appl. No.: 13/953,933

(22) Filed: Jul. 30, 2013

(65) Prior Publication Data
US 2015/0039967 A1 Feb. 5, 2015

(51) Int. Cl.
| | |
|---|---|
| *G06F 11/10* | (2006.01) |
| *G11C 11/401* | (2006.01) |
| *G11C 29/02* | (2006.01) |
| *G11C 29/50* | (2006.01) |
| *G11C 11/403* | (2006.01) |
| *G11C 11/406* | (2006.01) |

(52) U.S. Cl.
CPC ....... *G06F 11/108* (2013.01); *G11C 11/40626* (2013.01); *G11C 29/023* (2013.01); *G11C 29/028* (2013.01); *G11C 29/50016* (2013.01); *G06F 11/1024* (2013.01); *G06F 11/1048* (2013.01); *G06F 11/1068* (2013.01); *G11C 11/403* (2013.01); *G11C 11/406* (2013.01); *G11C 11/40603* (2013.01); *G11C 11/40611* (2013.01); *G11C 11/40615* (2013.01); *G11C 2211/4061* (2013.01); *G11C 2211/4062* (2013.01); *G11C 2211/4065* (2013.01); *G11C 2211/4068* (2013.01)

(58) Field of Classification Search
CPC .... G11C 11/401; G11C 11/403; G11C 11/406; G11C 11/40603; G11C 11/40611; G11C 11/40615; G11C 2211/401; G11C 2211/406; G11C 2211/4061; G11C 2211/4062; G11C 2211/4065; G06F 11/1008; G06F 11/1024; G06F 11/1048; G06F 11/1068; G06F 11/108
USPC ..................... 714/754, 764; 365/185.25, 222
See application file for complete search history.

(56) References Cited

U.S. PATENT DOCUMENTS

| | | | | |
|---|---|---|---|---|
| 6,199,139 | B1* | 3/2001 | Katayama ............. | G06F 1/3203 365/222 |
| 2002/0004921 | A1* | 1/2002 | Muranaka et al. ........... | 714/704 |
| 2006/0156180 | A1* | 7/2006 | Kang ............. | 714/758 |
| 2007/0011578 | A1* | 1/2007 | Lewis et al. .................. | 714/763 |
| 2009/0168571 | A1* | 7/2009 | Pyo et al. ..................... | 365/200 |
| 2012/0151299 | A1* | 6/2012 | Suh .............................. | 714/764 |
| 2012/0314483 | A1* | 12/2012 | Tsukada ....................... | 365/149 |

(Continued)

*Primary Examiner* — Albert Decady
*Assistant Examiner* — Christian Dorman
(74) *Attorney, Agent, or Firm* — Hauptman Ham, LLP

(57) ABSTRACT

A memory device includes a plurality of rows of memory cells, a refresh period determination unit, and a refresh control unit. The plurality of rows of memory cells includes a first row and one or more second rows. The refresh period determination unit is configured to set a refresh period according to read data from the first row. A refresh control unit is configured to control refreshing the one or more second rows based on the refresh period and to control obtaining the read data from the first row based on an adjustment interval.

23 Claims, 9 Drawing Sheets

(56) References Cited

U.S. PATENT DOCUMENTS

2012/0317352 A1* 12/2012 Kang et al. .................. 711/106

* cited by examiner

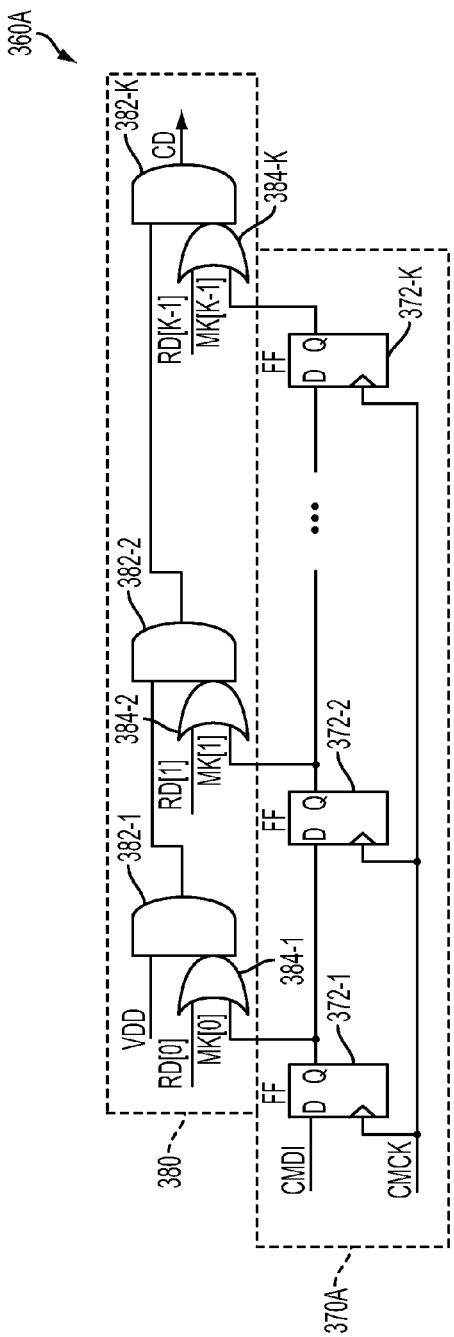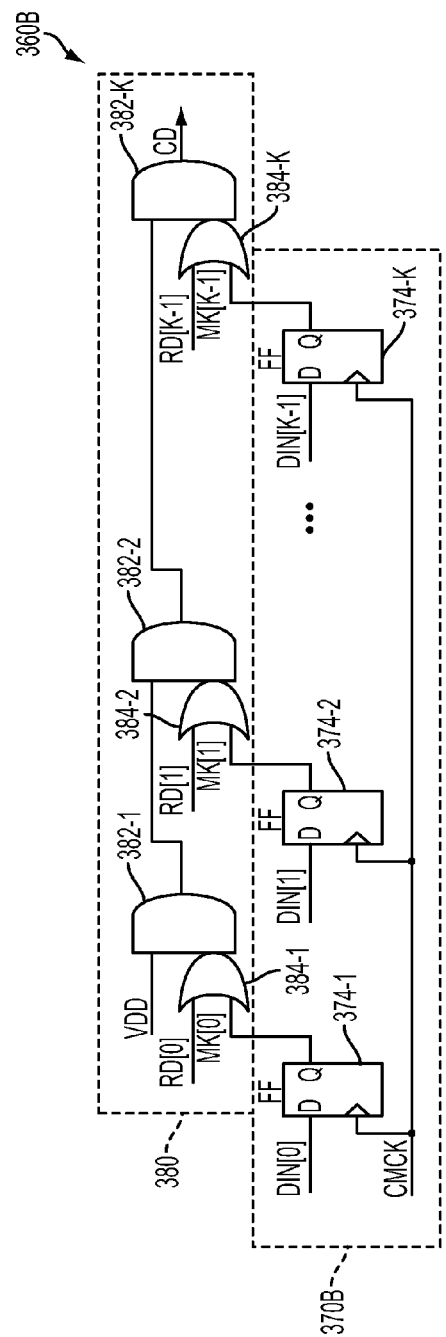
FIG. 3B
FIG. 3C

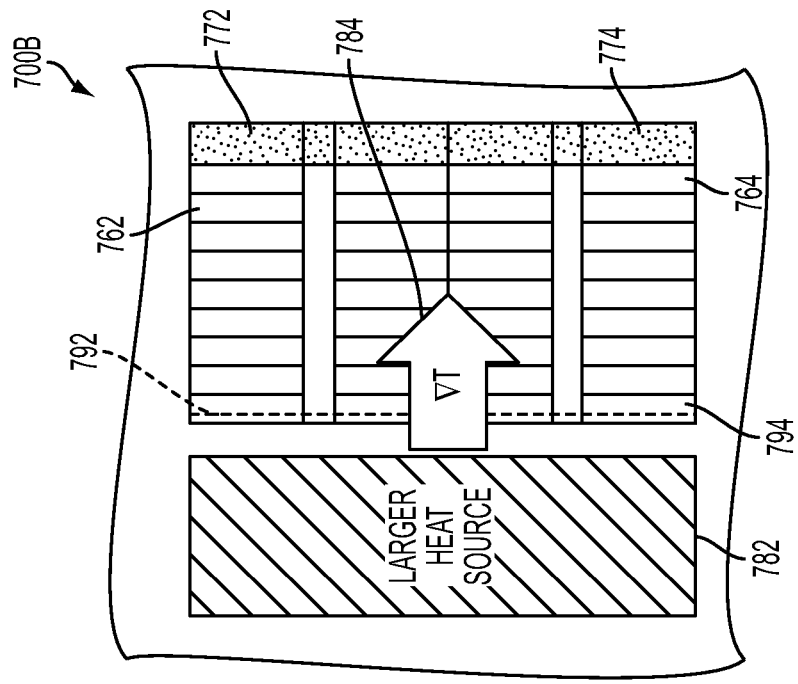
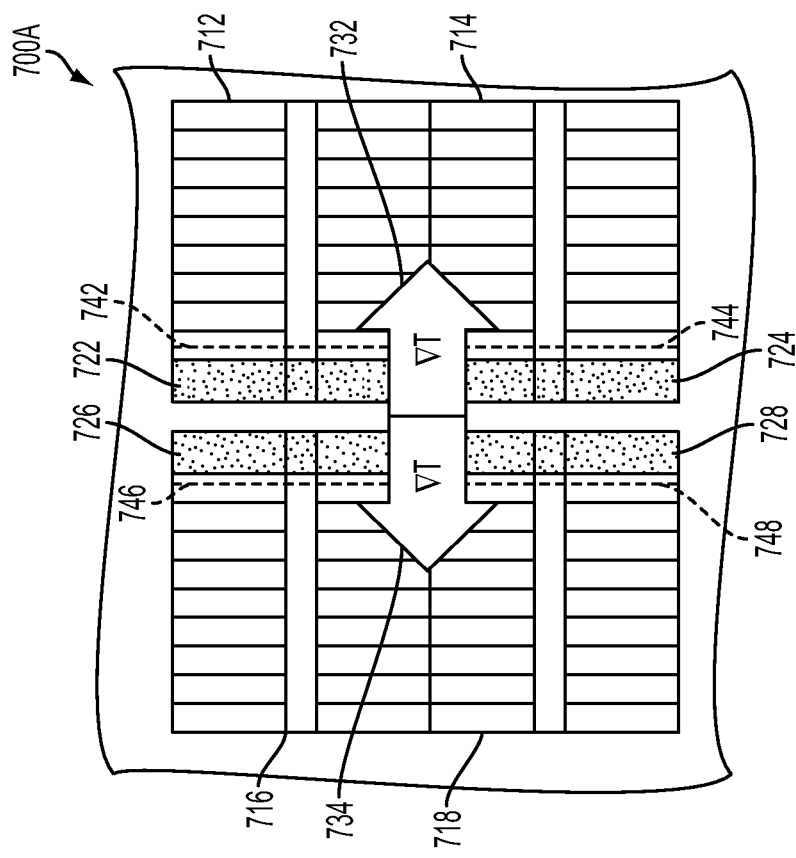
FIG. 7A
FIG. 7B

MEMORY DEVICE HAVING ADJUSTABLE REFRESH PERIOD AND METHOD OF OPERATING THE SAME

BACKGROUND

A dynamic random access memory (DRAM) circuit includes an array of capacitive storage memory cells accessible through corresponding access transistors. Data stored in each memory cell is an electrical charge stored on a capacitor, which dissipates over time through various leakage paths of the DRAM circuit. Therefore, the information stored in the memory cells is usually periodically recharged (also known as "refreshed") in order to retain the stored information. In some applications, a refresh control circuit of the DRAM circuit refreshes a row of memory cells every predetermined, fixed time intervals, and such predetermined time intervals is sometimes referred to as a refresh period of the DRAM circuit.

DESCRIPTION OF THE DRAWINGS

One or more embodiments are illustrated by way of example, and not by limitation, in the figures of the accompanying drawings, wherein elements having the same reference numeral designations represent like elements throughout.

FIGS. 3B and 3C are functional block diagrams of various configurations of an error detection unit in accordance with one or more embodiments.

FIGS. 7A and 7B are schematic diagrams of partial layout plans of various integrated circuits having eDRAM circuits and their corresponding dedicated rows in accordance with one or more embodiments.

DETAILED DESCRIPTION

Figure 1:
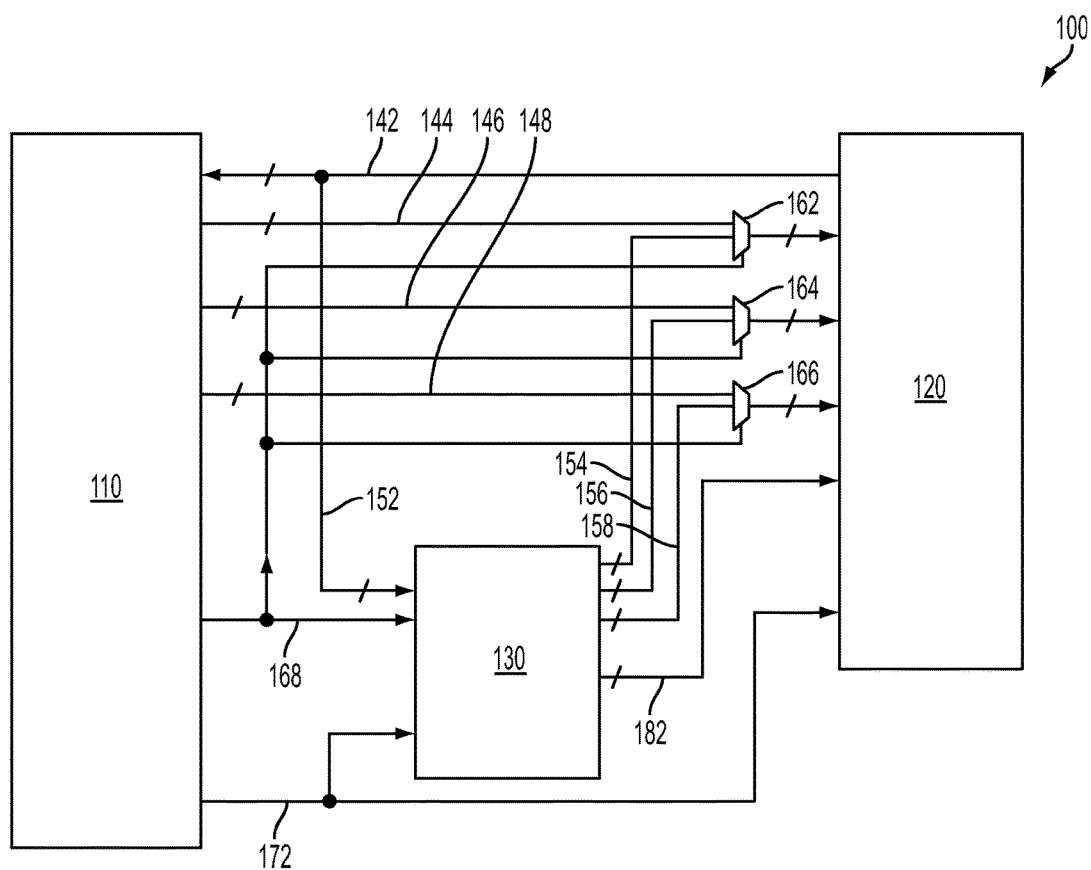
FIG. 1 is a functional block diagram of a system in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In some applications, characteristics of leakage paths of the DRAM circuit vary with temperature. Therefore, a fixed refresh period either fails to handle the operations of the DRAM circuit under certain temperature or has to be set to cover the contemplated worst scenario. In many applications, if the refresh period is set to be too short, unnecessary refresh operations are performed, which in turn causes increasing in power consumption. In many applications, if the refresh period is set to be too long, memory cells of the DRAM circuit have a higher risk of losing the data they store.

The present disclosure describes one or more embodiments of a memory device having an adjustable refresh period. By using the read data from a dedicated row of memory cells, the refresh period is adjusted to keep the refresh period as long as possible, but still sufficiently short to maintain the data stored in the memory circuit. The adjusting the refresh period and the access of the dedicated row according to the present disclosure are operated in a digital manner, and thus they are less vulnerable to temperature, voltage, or process variations.

FIG. 1 is a functional block diagram of a system 100 in accordance with one or more embodiments. System 100 includes a system-on-chip (SOC) 110, a memory circuit 120, and a built-in self-test with redundancy (BISTR) unit 130. In some embodiments, system 100 is part of a communication device, a network router, a network storage controller, or an integrated circuit usable in an electrical device.

SOC 110 includes electrical components integrated into a chip. In some embodiments, components of SOC 110 include a central processing unit (CPU), a data storage unit (e.g. registers), an input/output (I/O) controller, digital and/or analog circuits, or other suitable components. SOC 110 reads data from memory circuit 120 via bus 142 or writes data to memory circuit 120 via bus 144 corresponding to an address on bus 146. SOC 110 also sends a set of control signals to memory circuit 120 via bus 148. In some embodiments, the set of control signals includes a read/write enable signal indicating if a read or write operation of the memory circuit 120 is to be performed and a chip enable signal indicating if the memory circuit 120 is to be set in an active mode or a standby mode.

Memory circuit 120 includes a plurality of banks of memory cells and one or more control units. In some embodiments, memory circuit 120 is a dynamic random access memory (DRAM) circuit. In some embodiments, memory circuit 120 is an embedded DRAM (eDRAM) circuit.

BISTR unit 130 is usable to test memory cells of memory circuit 120 and repair failed memory cells, words, or columns by redirecting an access thereof from the SOC 110 to redundant memory cells, words, or columns. BISTR unit 130 is usable to read data from memory circuit 120 via bus 152 or writes data to memory circuit 120 via bus 154 corresponding to an address on bus 156. BISTR unit 130 is also usable to send an alternative set of control signals to memory circuit 120 via bus 158. In some embodiments, BISTR unit 130, through a non-volatile memory (not shown), stores addresses of rows having hard errors, mapping of redundant rows, and/or various parameters for operating the memory circuit 120.

Multiplexer 162, 164, and 166 are usable to determine whether buses 144, 146, and 148 or busses 154, 156, and 158 are electrically coupled with memory circuit 120 responsive to a BISTR enable signal via signal path 168. SOC also provides a system clock to memory circuit 120 and BISTR unit 130 through signal path 172.

BISTR unit 130 also sends another set of control signals to memory circuit 120 via bus 182. In some embodiments, bus 182 includes one or more control signals usable to control refresh of memory cells in memory circuit 120. In some embodiments, at least some of control signals usable to control refresh of memory cells in memory circuit 120 is on another signal path or another bus between SOC 110 and memory circuit 120. Refresh operation of the memory circuit are further described in detail below.

Figure 2:
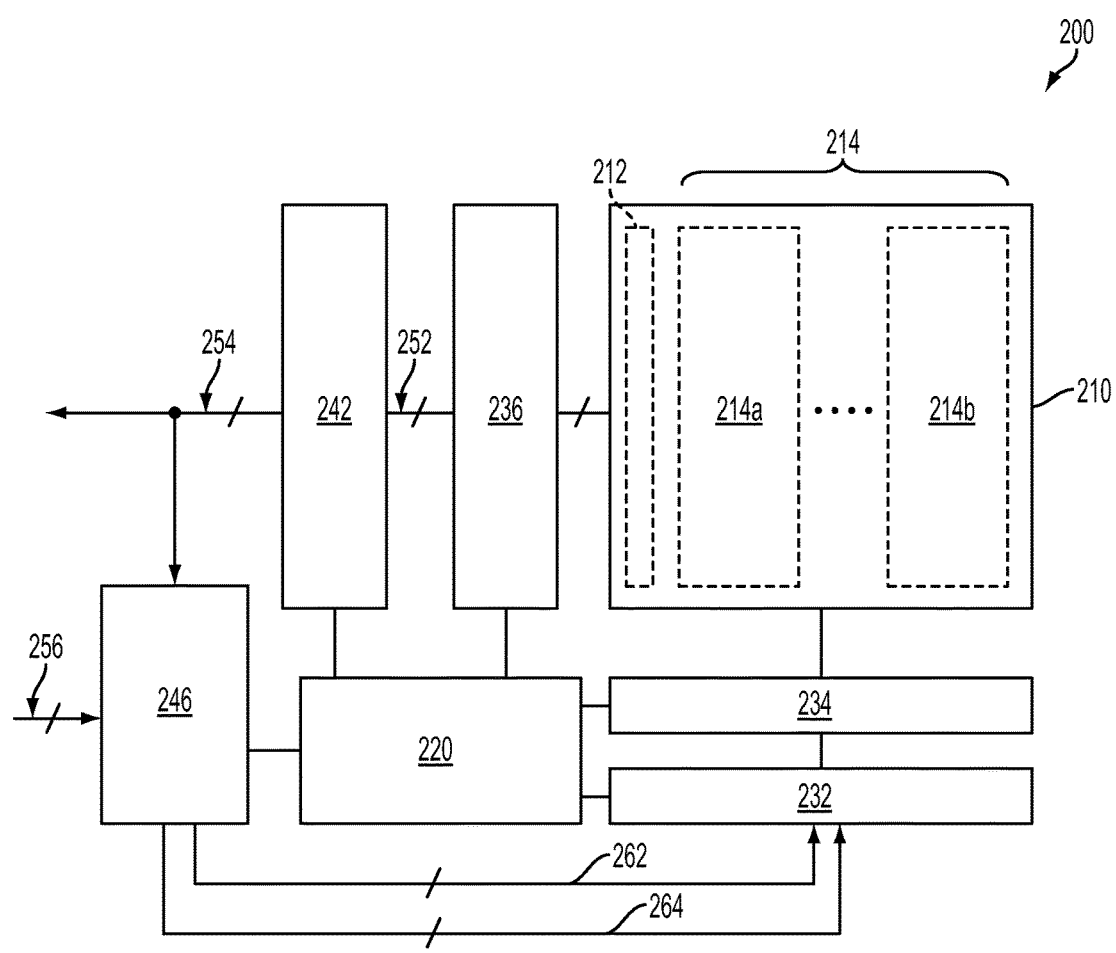
FIG. 2 is a functional block diagram of an embedded DRAM (eDRAM) circuit in accordance with one or more embodiments.

FIG. 2 is a functional block diagram of an embedded DRAM (eDRAM) circuit 200 in accordance with one or more embodiments. In some embodiments, eDRAM circuit 200 is usable as memory circuit 120 in FIG. 1.

eDRAM circuit 200 includes a memory array 210, a read/write control unit 220, a row/column decoder 232, a sense amplifier control unit 234, an input/output (I/O) unit 236, a refresh period determination unit 242, and a refresh control unit 246.

Memory array 210 includes at least a dedicated row of memory cells 212 and one or more other rows of memory cells 214. Dedicated row of memory cells 212 is suitable for performing an operation for refresh period adjustment. As depicted in FIG. 2, a top-bottom direction of the page is defined as a row direction for memory array 210, and each row of rows 212 and 214 thus have memory cells arranged along the top-bottom direction of the page. Rows of memory cells 214 are logically or functionally further divided into a plurality of memory banks 214a and 214b. In at least one embodiment, the dedicated row 212 is not used for storing any data accessible to SOC 110. In some embodiments, any row in the one or more other rows is capable of being assigned as the dedicated row of memory cells 212, and the previously assigned dedicated row of memory cells 212 is then released, e.g., for the use of storing data accessible to SOC 110. In some embodiments, one or more physical rows of memory array 210 are assigned as the dedicated row 212. Although dedicated row 212 is the left-most row in FIG. 2, in some embodiments, any one or more rows of the memory array 210 are suitable to be assigned as the dedicated row 212. In some embodiments, a physical row of the memory array 210 is configured to be assigned as the dedicated row 212 during an adjustment cycle for performing an operation for refresh period adjustment and as one of rows of memory cells 214 during another adjustment cycle.

Read/write control unit 220 controls the operations of row/column decoder 232, sense amplifier control unit 234, and I/O unit 236 via various control paths and/or buses (not labeled). Row/column decoder 232 receives column and row addresses of a word in the memory array 210 and decodes the addresses for sense amplifier control unit 234. Sense amplifier control unit 234 then drives sense amplifiers in the memory array 210 to either output data of the word or write data to the word corresponding to the received column and row addresses. I/O unit 236 is usable to buffer the data read from the word of memory array 210 or buffer the data to be written to the word of the memory array 210. In some embodiments, the term "word" is defined according to a data bus width (i.e., the number of bits) of the I/O unit 236.

Refresh period determination unit 242 is configured to set a refresh period according to read data from dedicated row 212 of memory array 210. Refresh period determination unit 242 receives the read data carried by bus 252 via the I/O unit 236 and then output the refresh period via bus 254. Refresh control unit 246, working in conjunction with the read/write control unit 220, is configured to control refreshing the one or more other rows 214 based on the refresh period carried by bus 254 and to control obtaining the read data carried by bus 252 from the dedicated row 212 based on an adjustment interval for performing an operation for refresh period adjustment. In some embodiments, adjustment interval is provided to refresh control unit 246 via bus 256. In some embodiments, a predetermined ratio of adjustment interval to refresh period is provided to refresh control unit 246 via bus 256, and refresh control unit 246 determines the adjustment interval based on refresh period and the predetermined ratio carried by bus 256. Furthermore, refresh control unit 246 sends a row address carried by bus 262 to row/column decoder 232 indicating the row of the one or more other rows 214 to be refreshed or the dedicated row 212 during an operation for refresh period adjustment. In some embodiments, bus 256 is coupled to BISTR unit 130 or SOC 110.

Refresh control unit 246 also sends a column address carried by bus 264 to row/column decoder 232 indicating the word of the dedicated row 212 to be accessed during an operation for refresh period adjustment. In the present disclosure, for illustration purposes, dedicated row 212 has M sets of K-bit words, where M and K are positive integers. In some embodiments, M is 1, 2, 4, 8, or 16. In some embodiments, K is 32, 64, 128, or 256.

Figure 3A:
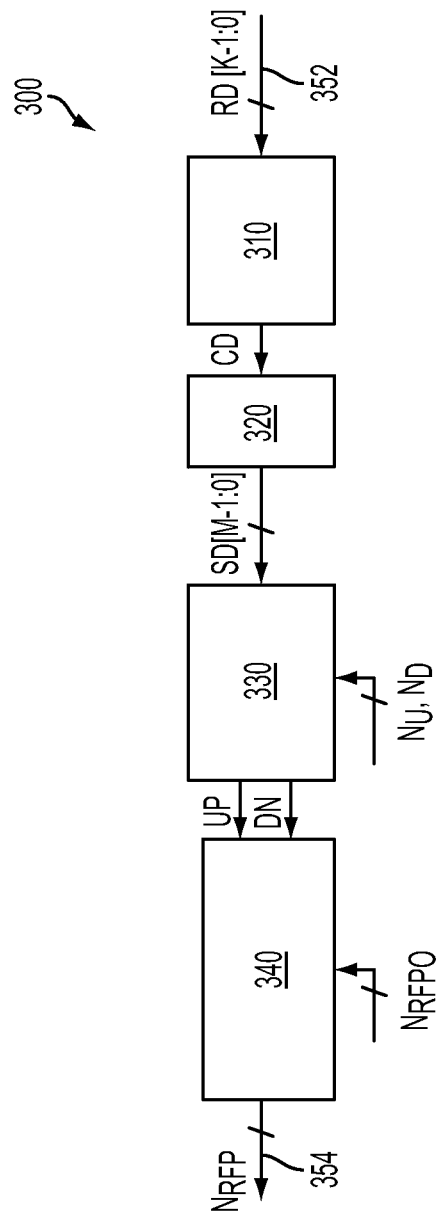
FIG. 3A is a functional block diagram of a refresh period determination unit in accordance with one or more embodiments.

FIG. 3A is a functional block diagram of a refresh period determination unit 300 in accordance with one or more embodiments. Refresh period determination unit 300 includes an error detection unit 310 connected with bus 352, a shift register 320, a band-stop filter 330, and an up/down counter 340 connected with bus 354. In some embodiments, refresh period determination unit 300 is usable as the refresh period determination unit 242 depicted in FIG. 2. As such, in some embodiments, bus 352 corresponds to bus 252 in FIG. 2, and bus 354 corresponds to bus 254 in FIG. 2.

Error detection unit 310 receives read data RD[K−1:] from dedicated row 212 through bus 362. In some embodiments, read data RD[K−1:] correspond to one of the M sets of K-bit words of the dedicated row 212 depicted in FIG. 2. Error detection unit 310 is configured to generate an error detection result CD based on the received read data RD[K−1:]. The error detection result CD has a predetermined logic value, such as a high logic value, if the read data RD[K−1:] contains an error for each adjustment cycle defined based on the adjustment interval. In some embodiments, one or more predetermined bits of read data RD[K−1:] are omitted according to masking data. In some embodiments, the omitted bits refer to memory cells that have a hard error or have an excessively high or low leakage current. Example circuits and detailed operation of error detection unit 310 are further described below in conjunction with FIGS. 3B and 3C.

Shift register 320 is configured to store error detection results CD from the error detection unit 310 corresponding to a predetermined number of consecutive adjustment cycles. The stored error detection results are identified as SD[M−1:0] in FIG. 3A. In some embodiments, the predetermined number of consecutive adjustment cycles includes a present adjustment cycle. In the embodiment depicted in FIG. 3A, the predetermined number equals M, which is the number of sets of K-bit words in the dedicated row 212. In some embodiments, the predetermined number is a positive integer number set to provide sufficient number of error detection results for band-stop filter 330.

Band-stop filter 330 is configured to generate control signals UP and DN based on the stored error detection results SD[M−1:0], a lower threshold value $N_U$, and an upper threshold value $N_D$. In some embodiments, control signal UP is set to have a high logic value when a number of the error detection results SD[M−1:0] that have the predetermined logic value indicating an error result (e.g., the high logic value) is less than the lower threshold value $N_U$. In some embodiments, control signal DN is set to have a high logic value when the number of the error detection results SD[M−1:0] that have the predetermined logic value indicating an error result (e.g., the high logic value) is greater than the upper threshold value $N_D$. In some embodiments, control signals UP and DN are set to have a low logic value when the number of the error detection results SD[M−1:0] that have the predetermined logic value indicating an error result (e.g., the high logic value) is equal to or within a range of the upper threshold value $N_D$ and the upper threshold value $N_U$.

In some embodiments, the upper threshold value $N_D$ and the lower threshold value $N_U$ are positive integers set to ensure a smooth adjustment of the refresh period while avoid unnecessary change of refresh period. In at least one embodiment where M=8, the upper threshold value $N_D$ is no less than 4, and the lower threshold value $N_U$ is less than 4. In some embodiments, the upper threshold value $N_D$ is no less than M/2, and the lower threshold value $N_U$ is less than M/2.

Up/down counter 340 adjusts refresh period and output the adjusted refresh period $N_{RFP}$ through bus 354. In some embodiments, up/down counter 340 adds a predetermined increment to a prior refresh period if control signal UP has the predetermined logic value, e.g., the high logic value. In some embodiments, up/down counter 340 subtracts a predetermined increment from a prior refresh period if control signal DN has the predetermined logic value, e.g., the high logic value. In the embodiments up/down counter 340 retains the refresh period if control signals DU and DN do not have the predetermined logic value, e.g., control signals DU and DN are at a low logic value. In the embodiment depicted in FIG. 3A, up/down counter 340 also loads an initial refresh period $N_{RFP0}$ when up/down counter 340 is powered on and initiated. In some embodiments, initial refresh period $N_{RFP0}$ is stored or hardwired within up/down counter.

FIG. 3B is a functional block diagram of an error detection unit 360A in accordance with one or more embodiments. In some embodiments, error detection unit 360A is usable as error detection unit 310 depicted in FIG. 3A. In the embodiment depicted in FIG. 3A, read data RD[K−1:] are expected to be all having a high logic value, which has a voltage value substantially the same as that of a power supply voltage level VDD.

Error detection unit 360A includes a masking unit 370A and a comparison unit 380. Masking unit 370A is configured to generate masking data MK[K−1:]. The comparison unit 380 is configured to omit one or more predetermined bits of the read data RD[K−1:] according to the masking data MK[K−1:0 ]. In the embodiment depicted in FIG. 3B, the masking unit 370A includes K flip-flops 372-1, 372-2, . . . , 372-K arranged in serial. In other words, a D-terminal of one of the flip-flops at a later stage is electrically coupled to a Q-terminal of another one of the flip-flops at a prior stage. A D-terminal of the first flip-flop 372-1 is configured to receive a data input signal CMDI. Trigger-terminals of the flip-flops 372-1, 372-2, . . . , 372-K are configured to receive a clock signal CMCK. Also, Q-terminals of the flip-flops 372-1, 372-2, . . . , 372-K are configured to output a corresponding one of masking data MK[K−1:]. For each rising edge of clock signal CMCK, a logic value of data input signal CMDI is stored at the Q-terminal of flip-flop 372-1, and a prior logic value at the Q-terminal of flip-flop 372-1 is stored at the Q-terminal of flip-flop 372-2. After K rising edges of clock signal CMCK, a K-bit masking data is pushed and stored at corresponding Q-terminals of flip-flops 371-1 to 371-K.

Comparison unit 380 includes logic gates, such as AND gates 382-1 to 382-K and OR gates 384-1 to 384-K. AND gates 382-1 to 382-K each have a first input coupled to a corresponding output of the OR gates 384-1 to 384-K. AND gates 382-2 to 382-K each have a second input coupled to a corresponding output a previous AND gate, and AND gate 381-1 has a second input configured to receive voltage level VDD (i.e., a logic high value). OR gates 384-1 to 384-K each have a first input coupled to a corresponding one of the plurality of flip-flops 371-1 to 371-K for receiving masking data MK[K−1:], and a second input configured to receive a corresponding one bit of the read data RD[K−1:].

Therefore, any bit of masking data MK[K−1:] at the logic high value sets the output of corresponding OR gate at the logic high value regardless the value of read data RD[K−1:]. As such, the corresponding read data is omitted. When all un-masked bits of read data RD[K−1:] are at the logic high value, all OR gates 384-1~384-K outputs high logic values, which in turn set the error detection result CD at the high logic value. On the other hand, if one of the un-masked bits of read data RD[K−1:] has a logic low value, the corresponding OR gate and AND gate and all downstream AND gates output the logic low value, which in turn set the error detection result CD at the low logic value.

FIG. 3C is a functional block diagram of another error detection unit 360B in accordance with one or more embodiments. In some embodiments, error detection unit 360B is usable as error detection unit 310 depicted in FIG. 3A. Components that are similar or the same as their counterparts in FIG. 3B are labeled with the same reference numbers, and detailed description thereof is omitted.

Error detection unit 360B includes a masking unit 370B and a comparison unit 380. The comparison unit 380 is the same as the comparison 380 in FIG. 3B. Masking unit 370B is configured to generate masking data MK[K−1:]. The comparison unit 380 is configured to omit one or more predetermined bits of the read data RD[K−1:] according to the masking data MK[K−1:]. In the embodiment depicted in FIG. 3C, the masking unit 370B includes K flip-flops 374-1, 374-2, . . . , 374-K arranged in parallel. In other words, each D-terminal of flip-flops 374-1 to 374-K is electrically coupled to a corresponding one of data input signals DIN[0]. . . DIN[K−1]. Trigger-terminals of the flip-flops 374-1, 374-2, . . . , 374-K are configured to receive a clock signal CMCK. Also, Q-terminals of the flip-flops 374-1, 374-2, . . . , 374-K are configured to output a corresponding one of masking data MK[K−1:]. Responsive to one rising edge of clock signal CMCK, logic values of data input signals DIN[K−1:] are stored at corresponding Q-terminals of flip-flop 374-1 to 374-K. Compared with the masking unit 370A, masking unit 370B is capable of storing masking data MK[K−1:] in one clock cycle of the clock signal CMCK, but requires K times the number of signal paths for carrying data input signals DIN[K−1:].

In some embodiments data input signals CMDI and DIN[K−1:] are provided by SOC 110 or BISTR unit 130 depicted in FIG. 1.

Error detection unit 360A and error detection unit 360B are examples. In some embodiments, not all bits of read data RD[K-1:] have high logic value. In some embodiments, read data RD[K-1:] have any predetermined value pattern, and the corresponding error detection unit suitable for detecting an error in the read data RD[K-1:] is different from error detection unit 360A and error detection unit 360B depicted in FIGS. 3B and 3C.

Figure 4:
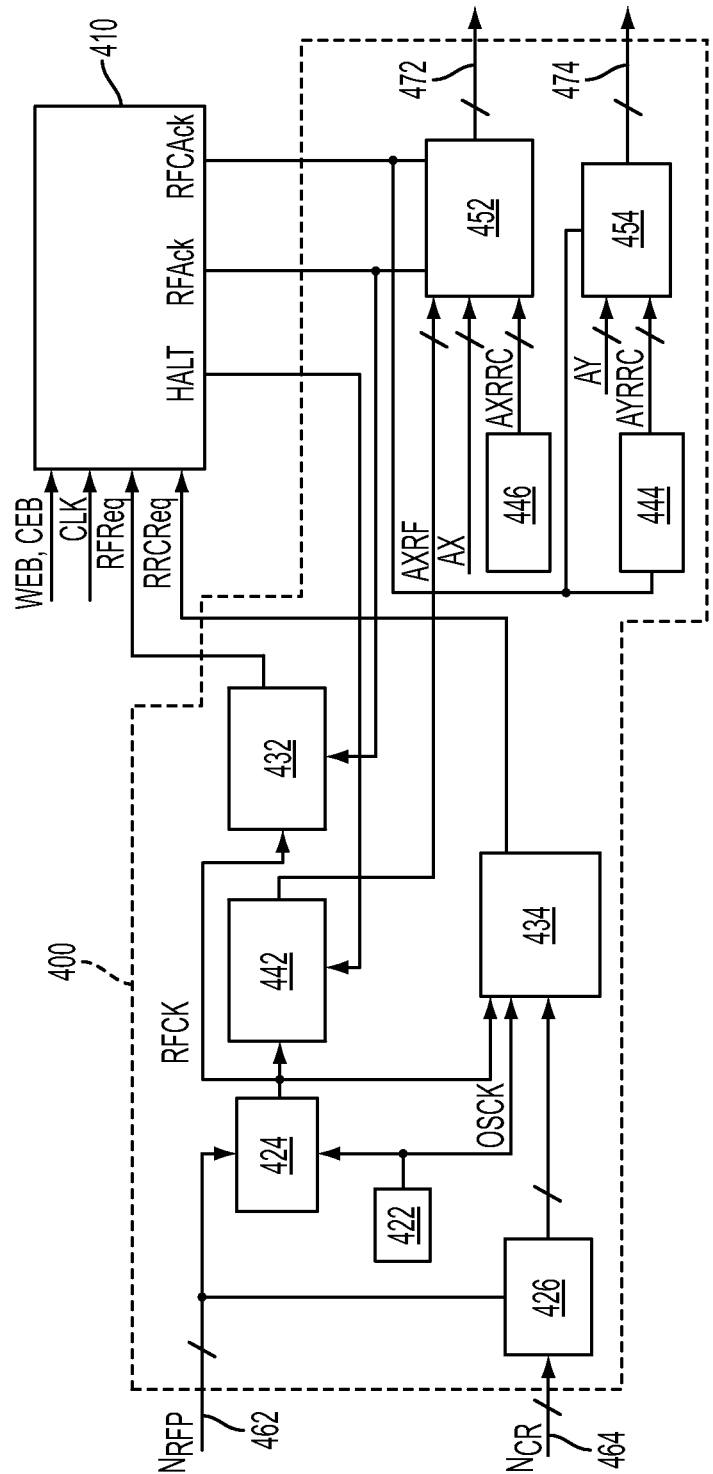
FIG. 4 is a functional block diagram of a control unit including a refresh control unit and a read/write control unit in accordance with one or more embodiments.

FIG. 4 is a functional block diagram of a refresh control unit 400 and a read/write control unit 410 in accordance with one or more embodiments. In some embodiments, refresh control unit 400 is usable as refresh control unit 246 in FIG. 2, and read/write control unit 410 is usable as read/write control unit 220 is FIG. 2.

Refresh control unit 400 includes an oscillator 422, a frequency divider 424, a period extender 426, a refresh request unit 432, an adjustment request unit 434, a refresh address counter 442, a column address counter 444, a row address register 446, a row address selector 452, and a column address selector 454. In some embodiments, one or more other functional units are also in refresh control unit 400 or read/write control unit 410. In some embodiments, one or more functional units depicted in FIG. 4 are omitted. In some embodiments, operations performed by one or more functional units depicted in FIG. 4 are collectively performed by one integrated unit or a plurality of functional units arranged in a manner different from the configuration depicted in FIG. 4.

Oscillator 422 generates a reference clock OSCK for refresh control unit 400. In some embodiments, reference clock OSCK has a frequency less than that of a system clock CLK that drives read/write control unit 410. Frequency divider 424 receives refresh period $N_{RFP}$ through bus 462. In some embodiments, bus 462 is electrically coupled to bus 354 in FIG. 3A. Frequency divider 424 is configured to generate a refresh clock RFCK based on reference clock OSCK and the refresh period $N_{RFP}$. In some embodiments, frequency divider 424 generates refresh clock RFCK by dividing reference clock OSCK by a ratio equal to refresh period $N_{RFP}$. In some embodiments, refresh clock RFCK has a frequency ranges from 10 MHz to 100 MHz. In some embodiments, refresh period $N_{RFP}$ is a positive integer ranging from 1 to 1024.

Period extender 426 receives an extending ratio $N_{CR}$ through bus 464 and refresh period $N_{RFP}$ and generates an adjustment interval $N_{RRC}$ based on extending ratio $N_{CR}$ and refresh period $N_{RFP}$. In some embodiments, $N_{RRC}=N_{CR}\times N_{RFP}$. In some embodiments, adjustment interval $N_{RRC}$ is the smallest positive integer no less than $N_{CR}\times N_{RFP}$. In some embodiments, extending ratio $N_{CR}$ is a positive integer ranging from 1 to 8.

Refresh request unit 432 receives refresh clock RFCK and generates a refresh request signal RFReq based on the refresh clock RFCK. Adjustment request unit 434 receives adjustment interval $N_{RRC}$, reference clock OSCK, and refresh clock RFCK, and generates an adjustment request signal RRCReq based on at least adjustment interval $N_{RRC}$ and reference clock OSCK. In some embodiments, adjustment request unit 434 generates an adjustment clock by dividing reference clock OSCK by a ratio equal to ($N_{RRC}$+ P). In some embodiments, P is a positive integer referring to the number of refresh cycles each operation for refresh period adjustment would take. In some embodiments, P equals two, because an operation for adjusting refresh period includes a read operation and a write operation each taking place during one refresh cycles. In some embodiments, adjustment request unit 434 generates adjustment clock by counting $N_{RRC}$ clock cycles of reference clock OSCK. In some embodiments, adjustment request unit 434 then generates adjustment request signal RRCReq based on adjustment clock and refresh clock RFCK.

Refresh address counter 442 is configured to set a row address AXRF of one or more other rows of memory cells 214 to be refreshed responsive to the refresh clock RFCK. Row address register 446 is configured to store a row address AXRRC of dedicated row 212. In some embodiments, row address AXRRC is loaded from BISTR unit 130. Row address selector 452 is configured to receive row address AXRF and row address AXRRC. Row address selector 452 is also configured to receive row address AX, which refers to a row address for a read/write operation of the memory array 210. Row address selector 452 is capable of outputting one set of row address among row addresses AXRF, AXRRC, and AX to row/column decoder 232 through bus 472. In some embodiments, bus 472 corresponds to bus 262 in FIG. 2.

Column address counter 444 is configured to set a column address AYRRC of dedicated refresh period adjusting row (212 in FIG. 2). Column address selector 454 is configured to receive column address AYRRC and column address AY, which refers to a column address for a read/write operation of the memory array (210 in FIG. 2). Column address selector 454 is capable of outputting one set of column address chosen from column addresses AYRRC, and AY to row/column decoder (232 in FIG. 2) through bus 474. In some embodiments, bus 474 corresponds to bus 264 in FIG. 2.

Read/write control unit 410 is configured to receive refresh request signal RFReq, adjustment request signal RRCReq, and one or more control signals, such as system clock CLK, read/write enable signal WEB and/or chip enable signal CEB. When read/write control unit 410 receives refresh request signal RFReq, read/write control unit 410 is set to perform a refresh operation and sends a refresh acknowledgement signal RFAck to other components, such as refresh request unit 432 and row address selector 452. In some embodiments, refresh acknowledgement signal RFAck is sent during a cycle when one of the one or more rows 214 of memory array 210 is not being accessed. When read/write control unit 410 receives adjustment request signal RRCReq, read/write control unit 410 is set to perform an operation for refresh period adjustment and sends an adjustment acknowledgement signal RFCAck to other components, such as row address selector 452, column address selector 454, and column address counter 444. In some embodiments, adjustment acknowledgement signal RFCAck is sent during a cycle when one of the one or more rows 214 of memory array 210 is not being accessed. Meanwhile, read/write control unit 410 sends a halt signal HALT to other components, such as refresh address counter 442, until the operation for refresh period adjustment is completed.

Figure 5:
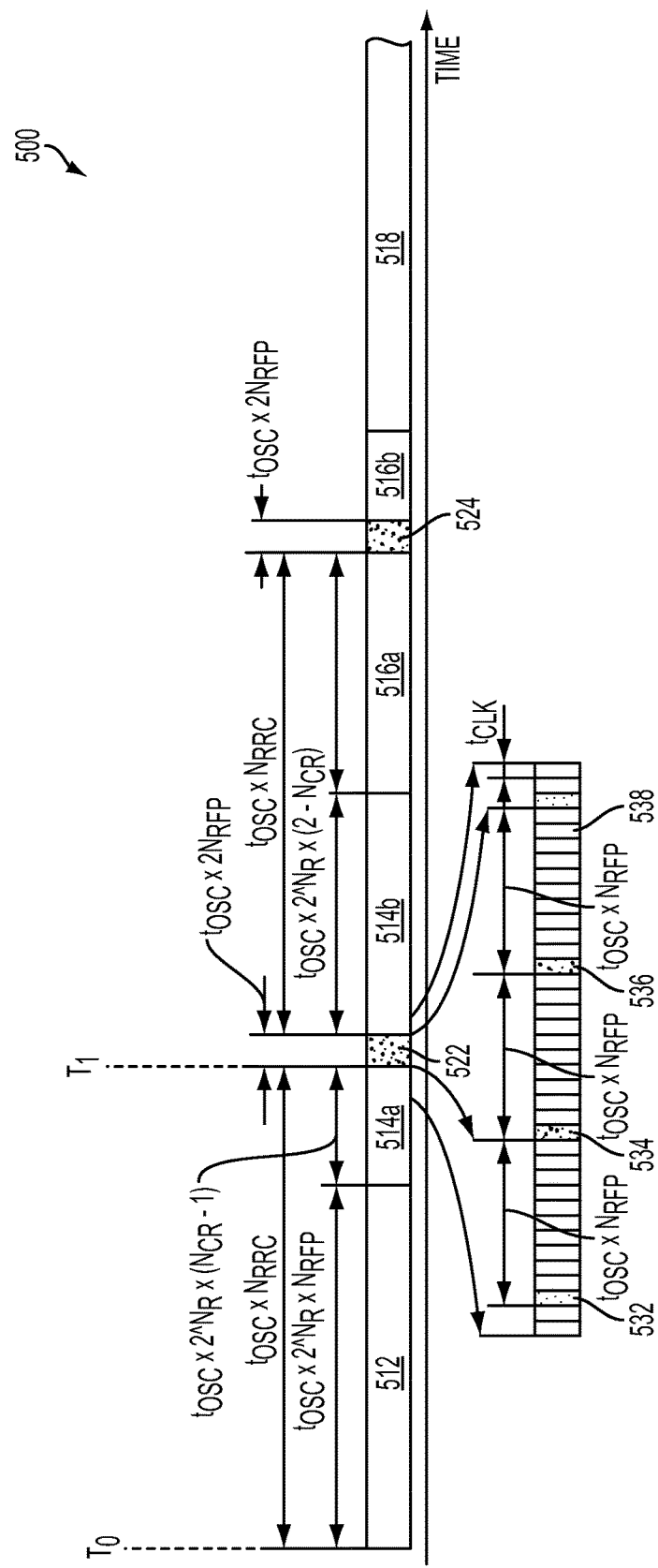
FIG. 5 is a timing diagram of allocating refresh cycles and allocating adjustment cycles in accordance with one or more embodiments.
Figure 6:
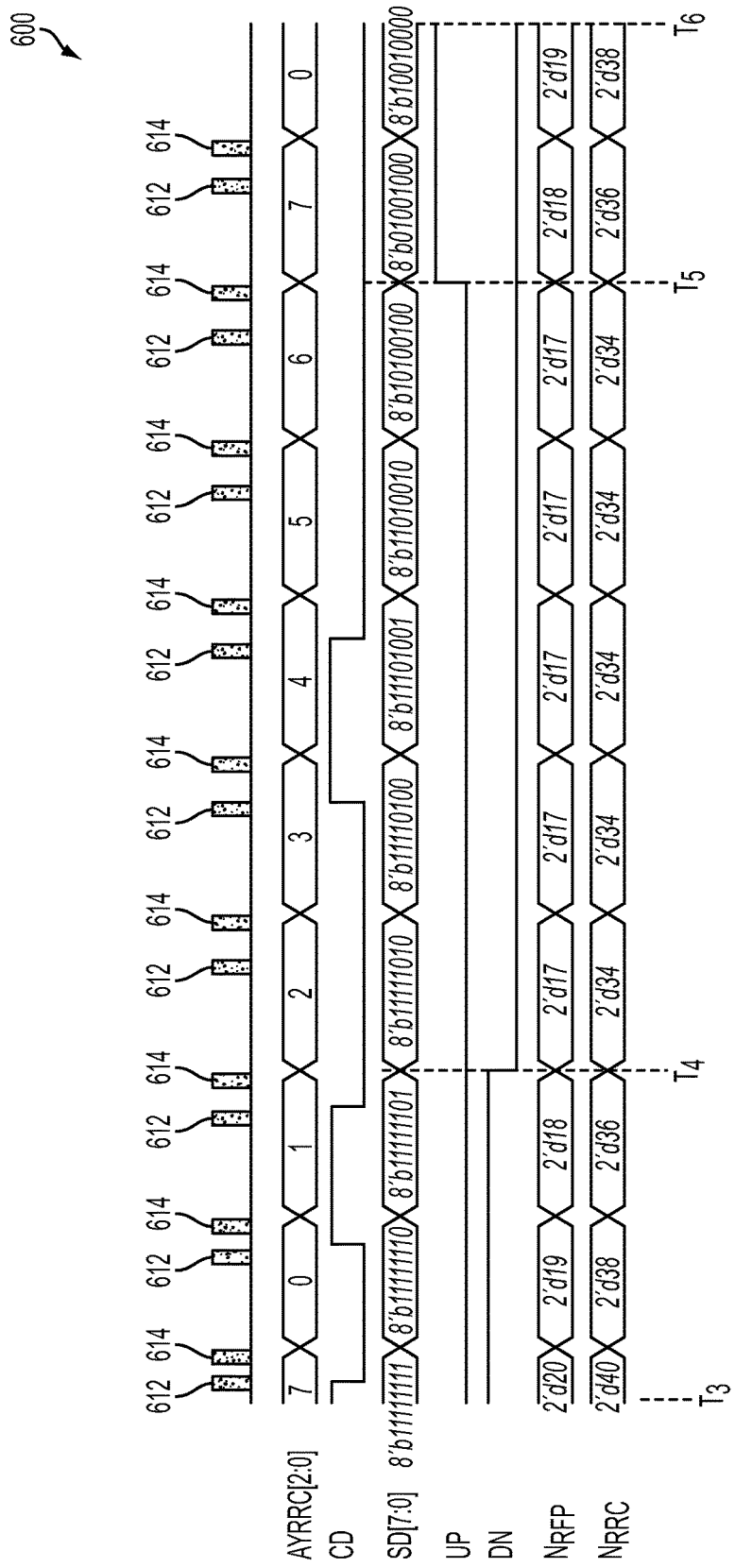
FIG. 6 is a timing diagram of adjusting a refresh period in accordance with one or more embodiments.

Detailed operations of circuits depicted in FIGS. 3A and 4 are further illustrated in conjunction with FIGS. 5 and 6.

FIG. 5 is a timing diagram 500 of allocating refresh cycles and allocating adjustment cycles using refresh period determination unit 300 depicted in FIG. 3A and refresh control unit 400 and read/write control unit 410 depicted in FIG. 4, in accordance with one or more embodiments. Timing diagram 500 includes four complete refresh cycles 512, 514 (including 514a and 514b), 516 (including 516a and 516b) and 518. Each complete refresh cycle includes $2^{\wedge}N_R$ (2 to the $N_R$-th power) refresh cycles, and thus occupies a time span of $t_{osc}\times 2^{\wedge}N_R\times N_{RFP}$, where $t_{osc}$ is time period of a clock cycle of reference clock OSCK, $N_R$ refers to a number of bit of row addresses for one or more other rows of memory cells 214, and $2^{\wedge}N_R$ represents a number of rows of one or more other rows of memory cells 214. Once the complete refresh cycle 512 ends, another complete refresh cycle 514 begins.

During each complete refresh cycle 512, 514, 516, or 518, refresh request unit 432 generates $2^{\wedge}N_R$ refresh request signals RFReq every time period $t_{osc} \times N_{RFP}$. Responsive to each refresh request signal RFReq, one of the one or more rows 214 is refreshed. In some embodiments, refreshing a row of memory cells takes one memory access cycle (indicated by time slot 532) having a time period $T_{CLK}$.

While refresh request unit 432 is tracking the number of time period $t_{osc}$ for generating refresh request signals RFReq, adjustment request unit 434 also keeps tracking the number of time period $t_{osc}$. After complete refresh cycle 514 begins for a time span of $t_{osc} \times 2^{\wedge}N_R \times (N_{CR}-1)$, a predetermined number ($t_{osc} \times N_{RRC}$) of time periods $t_{osc}$ has passed, and adjustment request unit 434 generates adjustment request signal RRCReq. Thus, an adjustment cycle 522, during which an operation for refresh period adjustment is performed, interrupts and is inserted into the complete refresh cycle 514. Adjustment cycle 522 has a time span of $t_{osc} \times 2N_{RFP}$. Responsive to a first refresh request signal RFReq during the adjustment cycle 522, read data RD[K−1:] is read from dedicated row 212 (time slot 534). Responsive to a second refresh request signal RFReq during the adjustment cycle 522, correct data RD[K−1:] is written back to dedicated row 212 (time slot 536).

In some embodiments, if read data RD[K−1:] is accurate, adjustment cycle 522 is completed without writing the correct RD[K−1:] back. In some embodiments, correct data RD[K−1:] is written back to dedicated row 212 regardless the accuracy of read data RD [K−1:].

Time slots, such as time slot 538, which do not correspond to any refresh request signal RFReq, are usable for performing read operations or write operations of memory array 210.

After adjustment cycle 522, complete refresh cycle 514 resumes to finish the remaining rows during a time span of $t_{osc} \times 2^{\wedge}N_R \times (2-N_{CR})$. Similarly, a predetermined number ($t_{osc} \times N_{RRC}$) of time $t_{osc}$ has passed after the completion of adjustment cycle 522, another adjustment cycle 524 begins.

FIG. 6 is a timing diagram 600 of adjusting a refresh period using refresh period determination unit 300 depicted in FIG. 3A and refresh control unit 400 and read/write control unit 410 depicted in FIG. 4 in accordance with one or more embodiments. Time slots 612 indicate reading data RD[K−1:] from dedicated row 212 (similar to time slot 534 in FIG. 5), and time slots 614 indicate writing back correct data RD[K−1:] to dedicated row 212 (similar to time slot 536 in FIG. 5). In this embodiment, lower threshold value $N_U$ is set to be 2, upper threshold value $N_D$ is set to be 6, ratio $N_{CR}$ is set to be 2, dedicated row has 8 words, and stored error detection results SD[7:0] is set to be 8'b 1111 1111 at the beginning. Every time error detection result CD is set to a logic high value or a logic low value, and the value of CD is pushed to stored error detection results SD[7:0].

As depicted in FIG. 6, when SD[7:0] has no less than 6 1's (between time $T_3$ to $T_4$), signal DN is set to high logic value; when SD[7:0] has no greater than 2 1's (between time $T_5$ to $T_6$), signal UP is set to high logic value. When signal DN is set to high logic value, $N_{RFP}$ is decreased by 1 every refresh period, and $N_{RRC}$ is decreased by 2 every refresh period (because ratio $N_{CR}$ is set to be 2). When signal UP is set to high logic value, $N_{RFP}$ is increased by 1 every refresh period, and $N_{RRC}$ is increased by 2 every refresh period (because ratio $N_{CR}$ is set to be 2).

FIG. 7A is a schematic diagram of a partial layout plan 700A of an integrated circuit having an eDRAM circuit (such as memory circuit 200) and corresponding dedicated rows in accordance with one or more embodiments. In some embodiments, current leakage of memory cells increases with an operation temperature. In some embodiments, the dedicated row is positioned nearby a heat source of the integrated circuit.

For example, eDRAM circuit depicted in layout plan 700A has four memory blocks 712, 714, 716, and 718 each having a corresponding driving circuit 722, 724, 726 and 728 positioned adjacent to one another. Driving circuit 722, 724, 726 and 728 are heat sources of memory blocks 712, 714, 716, and 718 and causes a temperature gradient toward memory cell areas of memory blocks 712, 714, 716, and 718 (as indicated by arrows 732 and 734). Therefore, rows 742, 744, 746, and 748, which are adjacent to the heat sources 722, 724, 726 and 728, are assigned as dedicated rows.

FIG. 7B is a schematic diagram of a partial layout plan 700B of another integrated circuit having an eDRAM circuit (such as memory circuit 200) and corresponding dedicated rows in accordance with one or more embodiments. eDRAM circuit depicted in layout plan 700B has two memory blocks 762 and 764 each having driving circuit 772 and 774. However, another circuit block 782 external to memory blocks 762 and 764 dominates the temperature gradient from memory cell areas of memory blocks 772 and 774 toward the sense amplifier and driving circuit 772 and 774 (as indicated by arrows 784). Therefore, rows 792 and 794, which are away from secondary heat sources 772 and 774 but adjacent to primary heat source 782, are assigned as dedicated rows.

Figure 8:
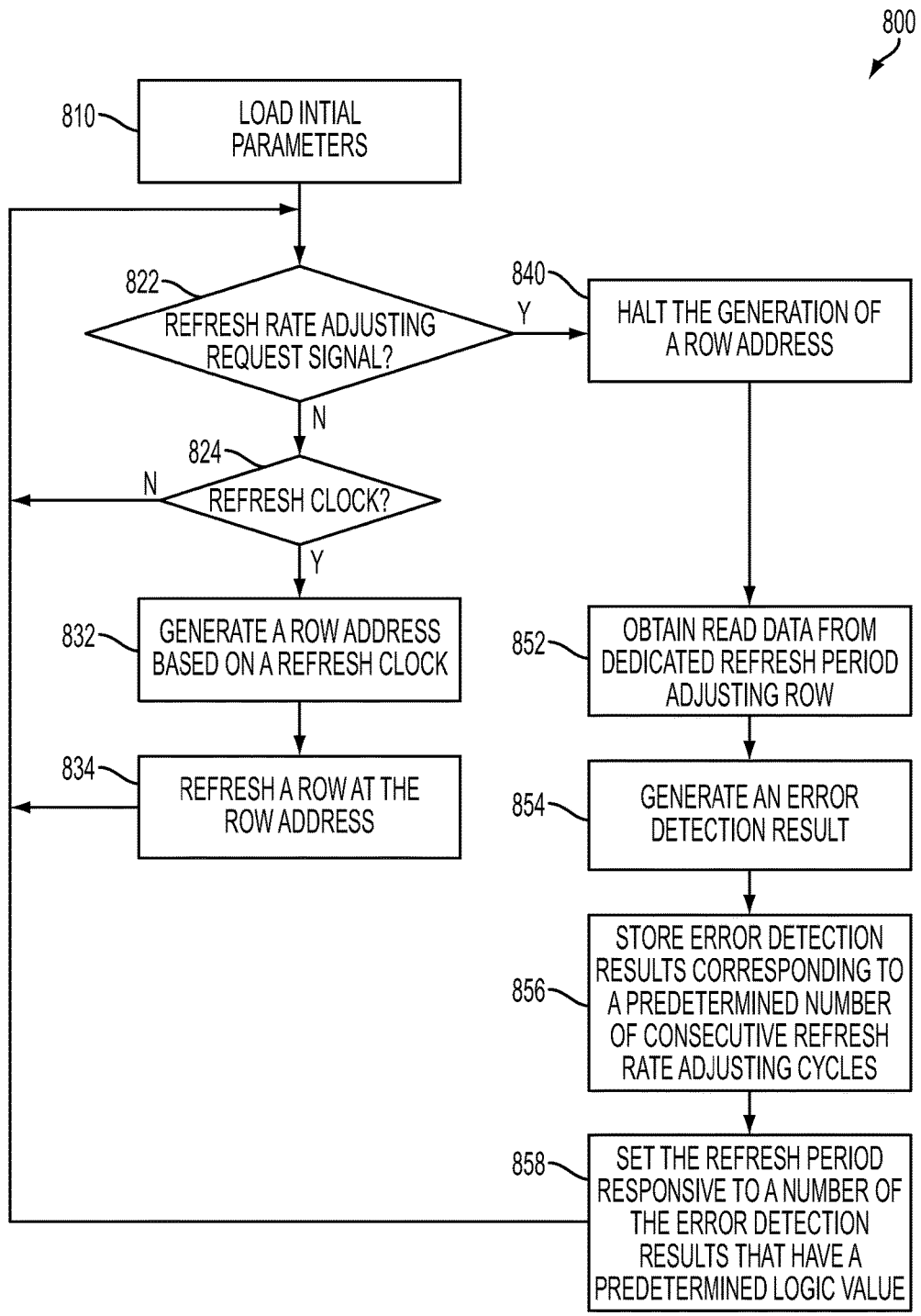
FIG. 8 is a flow chart of a method of operating an eDRAM circuit in accordance with one or more embodiments.

FIG. 8 is a flow chart of a method 800 of operating an eDRAM circuit (such as memory circuit 120 in FIG. 1) in accordance with one or more embodiments. It is understood that additional operations may be performed before, during, and/or after the method 800 depicted in FIG. 8, and that some other processes may only be briefly described herein.

As depicted in FIGS. 8, 1, 2, 3A, and 4, in operation 810, memory circuit 120 loads initial parameters for performing the refresh operation and the operation for refresh period adjustment. In some embodiments, up/down counter 340 receives initial refresh period $N_{RFP0}$ as current refresh period $N_{RFP}$, band-stop filter 330 receives upper threshold value $N_D$ and lower threshold value $N_F$. In some embodiments, error detection unit 310 loads masking data MK[K−1:]. In some embodiments, shift register 320 loads initial values for stored error detection results SD[M−1:0]. In some embodiments, row address register 446 receives row address AXRRC of dedicated row 212.

In some embodiments, some or all of the initial values are provided by BISTR unit 130. In some embodiments, some or all of the initial values are provided by SOC 110. In some embodiments, some or all of the initial values are hard-wired or stored in the memory circuit 120.

Also, a refresh clock RFCK is generated by dividing a reference clock OSCK based on the refresh period $N_{RFP}$. A refresh request signal RFReq is generated based on the refresh clock RFCK. An adjustment request signal RRCReq is generated based on the reference clock OSCK and an adjustment interval $N_{RRC}$. In some embodiments, adjustment interval $N_{RRC}$ is generated based on ratio $N_{CR}$ and refresh period $N_{RFP}$. In some embodiments, $N_{RRC} = N_{CR} \times N_{RFP}$.

As depicted in FIGS. 8 and 4, in operation 822, read/write control unit 410 determines the presence of an adjustment request signal RRCReq. If a valid adjustment request signal RRCReq does not exist, method 800 proceeds to operation 824, where read/write control unit 410 further determines the presence of a refresh request signal RFReq. In operation 824, when it is determined that read/write control unit 410 has received a valid refresh request signal RFReq, method 800 proceeds to operation 832. On the other hand, when it is determined that read/write control unit 410a has not received a valid refresh request signal RFReq, method 800 proceeds to operation 822.

As depicted in FIGS. 8 and 4, in operation 832, after receiving a valid refresh request signal RFReq, refresh address counter 442 is configured to renew a row address AXRF of one or more other rows of memory cells 214. Then, in operation 834, read/write control unit 410 works in conjunction with row address selector 452 to perform a refresh operation on the row identified by the row address AXRF.

After operation 834, the method 800 proceeds to operation 822. Therefore, until receiving a valid adjustment request signal RRCReq, operations 822, 824, 832, and 834 keep refreshing one or more other rows of memory cells 214, one row at a time responsive to refresh request signal RFReq.

In operation 822, if it is determined that a valid adjustment request signal RRCReq is received, the method proceeds to operation 840. In operation 840, read/write control unit 410 informs row address selector 452 and column address selector 454 that an operation for refresh period adjustment is to be performed. Read/write control unit 410 also sends a halt signal HALT to refresh address counter 442 for halting the generating the row address AXRF.

As depicted in FIGS. 8 and 2, in operation 852, read data RD[K-1:] corresponding to a word of the dedicated row 212 is obtained. In some embodiments, any physical row of the memory array 210 is usable as the dedicated row 212 or as one of rows of memory cells 214 during various adjustment cycles. In some embodiments, operation 852 further includes assigning a physical row of memory array 210 that is assigned as one of the one or more other rows 214 during a previous adjustment cycle as the dedicated row 212 for a present adjustment cycle. In some embodiments, assigning the dedicated row 212 is performed by SOC 110 (FIG. 1) or BISTR 130.

As depicted in FIGS. 8 and 3A, in operation 854, an error detection result CD having a predetermined logic value (e.g., a logic high value) is generated if the read data RD[K-1:] contains an error for each adjustment cycle defined based on the adjustment interval $N_{RRC}$. In some embodiments, one or more predetermined bits of the read data RD[K-1:] are omitted according to masking data MK[K-1:].

As depicted in FIGS. 8 and 3A, in operation 856, error detection results SD[M-1:0] corresponding to a predetermined number of consecutive adjustment cycles are stored in shift register 320. In some embodiments, the storing is performed by pushing a current error detection result CD to shift register 320. Thus, the predetermined number of consecutive adjustment cycles includes a present adjustment cycle, and an oldest detection result CD is discarded from shift register 320.

As depicted in FIGS. 8 and 3A, in operation 856, refresh period $N_{RFP}$ is set by adding a predetermined increment to or subtracting the predetermined increment from a prior refresh period responsive to a number of the error detection results that have the predetermined logic value. For example, in the embodiment depicted in FIG. 6, the predetermined increment is added to the prior refresh period if the number of the error detection results that have the predetermined logic value is less than a lower threshold value $N_U$; and the predetermined increment is subtracted from the prior refresh period if the number of the error detection results that have the predetermined logic value is greater than a higher threshold value $N_D$.

Therefore, operations 852 through 858 set refresh period $N_{RFP}$ according to the read data RD[K-1:] from the dedicated row 212. In some embodiments, after operation 858, the method 800 writes correct read data RD[K-1:] back to the address the read data RD[K-1:] was obtained. This write-back operation functions as refreshing the word of the dedicated row 212 used for the present adjustment operation. After operation 858, the method 800 proceeds to operation 822. A regular refresh operation is resumed again by performing operations 822 through 834 until another valid adjustment request signal RRCReq is received.

In accordance with one embodiment, a memory device includes a plurality of rows of memory cells, a refresh period determination unit, and a refresh control unit. The plurality of rows of memory cells includes a first row and one or more second rows. The refresh period determination unit is configured to set a refresh period according to read data from the first row. A refresh control unit is configured to control refreshing the one or more second rows based on the refresh period and to control obtaining the read data from the first row based on an adjustment interval.

In accordance with another embodiment, a method of operating a memory, which includes a first row of memory cells and one or more second rows of memory cells, includes obtaining read data from the first row based on an adjustment interval. A refresh period is set according to the read data from the first row. The one or more second rows is refreshed based on the refresh period.

In accordance with another embodiment, a memory device includes a plurality of rows of memory cells, a frequency divider, a refresh request unit, an adjustment request unit, a refresh address counter, and a read/write control unit. The plurality of rows of memory cells includes a first row and one or more second rows. The frequency divider is configured to generate a refresh clock based on a reference clock and a refresh period. The refresh request unit is configured to generate a refresh request signal based on the refresh clock. The adjustment request unit is configured to generate an adjustment request signal based on the reference clock and a adjustment interval. The refresh address counter is configured to set a row address responsive to the first clock and to be halted responsive to a halt signal. The read/write control unit is configured to control: (a) receiving the adjustment request signal; (b) setting the halt signal at a first predetermined logic value responsive to the adjustment request signal; (c) reading data from the first row; and (d) refreshing one of the one or more second rows responsive to the refresh request signal if the halt signal is at the first predetermined logic value.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a plurality of rows of memory cells, comprising a first row and one or more second rows;
    a refresh period determination unit configured to set a refresh period according to read data from the first row; and
    a refresh control unit configured to:
        control refreshing the one or more second rows based on the refresh period,
        receive the refresh period from the refresh determination unit, and
        based on an adjustment interval derived from the refresh period, initiate obtaining the read data from the first row.

2. The memory device of claim 1, wherein a row of the plurality of rows is configured to be assigned as the first row during an adjustment cycle and as one of the one or more second rows during another adjustment cycle.

3. The memory device of claim 1, wherein the refresh period determination unit comprises:
    an error detection unit configured to generate, for each refresh period adjusting cycle defined based on the adjustment interval, an error detection result, the error detection result having a predetermined logic value if the read data contains an error; and
    a shift register configured to store error detection results from the error detection unit corresponding to a predetermined number of consecutive adjustment cycles, the predetermined number of consecutive adjustment cycles including a present adjustment cycle,
    wherein the refresh period determination unit is configured to set the refresh period according to a prior refresh period and/or a predetermined increment responsive to a number of error detection results stored in the shift register that have the predetermined logic value.

4. The memory device of claim 3, wherein the refresh period determination unit is configured to set the refresh period by
    adding the predetermined increment to the prior refresh period if the number of the error detection results that have the predetermined logic value is less than a lower threshold value; and
    subtracting the predetermined increment from the prior refresh period if the number of the error detection results that have the predetermined logic value is greater than a higher threshold value.

5. The memory device of claim 1, wherein the refresh period determination unit comprises:
    an error detection unit configured to generate an error detection result indicating if the read data contains an error for each adjustment cycle defined based on the adjustment interval, the error detection unit comprising:
        a masking unit configured to generate masking data;
        a comparison unit configured to omit one or more predetermined bits of the read data according to the masking data.

6. The memory device of claim 5, wherein
    the masking unit comprises a plurality of flip-flops arranged in serial or in parallel; and
    the comparison unit comprises a plurality of logic gates, each having a first input and a second input, the first input coupled to a corresponding one of the plurality of flip-flops, and the second input configured to receive a corresponding one bit of the read data.

7. The memory device of claim 1, wherein the refresh control unit comprises:
    a frequency divider configured to generate a refresh clock based on a reference clock and the refresh period;
    a refresh request unit configured to generate a refresh request signal based on the reference clock; and
    an adjustment request unit configured to generate an adjustment request signal based on the reference clock and the adjustment interval.

8. The memory device of claim 7, wherein the refresh control unit further comprises:
    a refresh address counter configured to set a row address responsive to the refresh clock and to be halted responsive to the adjustment request signal; and
    a column address counter configured to set a column address responsive to the adjustment request signal.

9. The memory device of claim 8, wherein the read data from the first row corresponds to a word at the column address of the first row.

10. A method of operating a memory having a first row of memory cells and one or more second rows of memory cells, the method comprising:
    obtaining read data from the first row based on an adjustment interval;
    setting a refresh period according to the read data from the first row;
    determining the adjustment interval from the refresh period; and
    refreshing, by a hardware circuit, the one or more second rows based on the refresh period.

11. The method of claim 10, further comprising:
    assigning a row of the memory that is assigned as one of the one or more second rows during a previous adjustment cycle as the first row for a present adjustment cycle.

12. The method of claim 10, wherein the setting the refresh period comprises:
    generating, for each adjustment cycle defined based on the adjustment interval, an error detection result having a predetermined logic value if the read data contains an error;
    storing error detection results corresponding to a predetermined number of consecutive adjustment cycles, the predetermined number of consecutive adjustment cycles including a present adjustment cycle; and
    setting the refresh period according to a prior refresh period and/or a predetermined increment responsive to a number of the error detection results that have the predetermined logic value.

13. The method of claim 12, wherein the setting the refresh period comprises:
    adding the predetermined increment to the prior refresh period if the number of the error detection results that have the predetermined logic value is less than a lower threshold value; and
    subtracting the predetermined increment from the prior refresh period if the number of the error detection results that have the predetermined logic value is greater than a higher threshold value.

14. The method of claim 12, wherein the generating the error detection result comprises:
    omitting one or more predetermined bits of the read data.

15. The method of claim 11, further comprising:
    generating a refresh clock by dividing a reference clock based on the refresh period; and generating an adjustment request signal based on the reference clock and the adjustment interval.

16. The method of claim 15, wherein the refreshing the one or more second rows further comprises:
generating a row address based on the refresh clock; and
halting the generating the row address responsive to the adjustment request signal.

17. A memory device, comprising:
a plurality of rows of memory cells, comprising a first row and one or more second rows;
a frequency divider configured to generate a refresh clock based on a reference clock and a refresh period;
a refresh request unit configured to generate a refresh request signal based on the refresh clock; and
an adjustment request unit configured to generate an adjustment request signal based on the reference clock and an adjustment interval derived from the refresh period;
a refresh address counter configured to set a row address responsive to the refresh clock and to be halted responsive to a halt signal;
a read/write control unit configured to control:
receiving the adjustment request signal;
setting the halt signal at a first predetermined logic value responsive to the adjustment request signal;
reading data from the first row; and
refreshing one of the one or more second rows responsive to the refresh request signal if the halt signal is at the first predetermined logic value.

18. The memory device of claim 17, wherein a row of the plurality of rows is configured to be assigned as the first row during an adjustment cycle and as one of the one or more second rows during another adjustment cycle.

19. The memory device of claim 17, further comprising:
a refresh period determination unit configured to set the refresh period according to the read data from the first row.

20. The memory device of claim 19, wherein the refresh period determination unit comprises:
an error detection unit configured to generate an error detection result, the error detection result having a second predetermined logic value if the read data contains an error for each adjustment cycle defined based on the adjustment interval; and
a shift register configured to store error detection results from the error detection unit corresponding to a predetermined number of consecutive adjustment cycles, the predetermined number of consecutive adjustment cycles including a present adjustment cycle,
wherein the refresh period determination unit is configured to set the refresh period according to a prior refresh period responsive to a number of the error detection results stored in the shift register that have the second predetermined logic value.

21. The memory device of claim 20, wherein the refresh period determination unit is configured to set the refresh period by
adding the predetermined increment to the prior refresh period if the number of the error detection results that have the predetermined logic value is less than a lower threshold value; and
subtracting the predetermined increment from the prior refresh period if the number of the error detection results that have the predetermined logic value is greater than a higher threshold value.

22. The memory device of claim 19, wherein the refresh period determination unit comprises:
an error detection unit configured to generate an error detection result indicating if the read data contains an error for each refresh period adjusting cycle defined based on the adjustment interval, the error detection unit comprising:
a masking unit configured to generate masking data;
a comparison unit configured to omit one or more predetermined bits of the read data according to the masking data.

23. The memory device of claim 22, wherein
the masking unit comprises a plurality of flip-flops arranged in serial or in parallel; and
the comparison unit comprises a plurality of logic gates, each having a first input and a second input, the first input coupled to a corresponding one of the plurality of flip-flops, and the second input coupled to a corresponding one bit of the read data.

* * * * *